United States Patent [19]

Yevick

[11] 4,150,478
[45] Apr. 24, 1979

[54] PUNCH DUPLICATING PROCESS

[75] Inventor: George J. Yevick, Leonia, N.J.

[73] Assignee: Izon Corporation, Stamford, Conn.

[21] Appl. No.: 583,210

[22] Filed: Jun. 3, 1975

[51] Int. Cl.² .......................................... B22D 11/126
[52] U.S. Cl. ............................. 29/527.2; 29/469.5;
264/156; 264/1; 264/220; 353/27 R; 352/244;
352/67; 350/319; 350/DIG. 1; 350/3.69
[58] Field of Search ........................ 29/527.2, 469.5;
353/27, 120; 264/154, 156, 1, 227, 220;
350/319, 3.5, DIG. 1; 352/244, 67

[56] References Cited
U.S. PATENT DOCUMENTS

| | | | |
|---|---|---|---|
| 3,619,024 | 11/1977 | Frattarola | 264/1 |
| 3,662,041 | 5/1972 | Hartman | 264/1 |
| 3,824,609 | 7/1974 | Tevick | 354/109 |
| 3,839,514 | 10/1974 | Nauta | 29/148.4 D |
| 3,864,034 | 2/1975 | Yevick | 353/120 |
| 3,865,485 | 2/1975 | Yevick | 355/46 |
| 3,882,207 | 5/1975 | Hannan et al. | 264/1 |

Primary Examiner—C. W. Lanham
Assistant Examiner—V. K. Rising
Attorney, Agent, or Firm—Thomas J. Greer, Jr.; Daniel M. Rosen

[57] ABSTRACT

A method of making copies of information sets of the type carried by microfiche elements having integral lenses on one surface thereof. The copy is made by embossing the top surface of a plastic, planar blank to form the integral lenses. The bottom surface of the blank is provided with a thin, opaque coating. The coating is ruptured by a stamping block, the ruptured portions forming optical apertures in the coating. These apertures function in a manner analogous to developed images in a photographic emulsion. Thus, microfiche copies may be made without the use of silver bromide. The selective rupture process may also be employed in the duplication of motion picture film.

5 Claims, 7 Drawing Figures

PUNCH DUPLICATING PROCESS

This invention relates to a method of making microfiche elements, particularly in mass production thereof.

My U.S. Pat. No. 3,864,034 describes a novel microfiche construction and method of making it. That patent describes the fabrication of a microfiche having a photographic emulsion on one surface and a plurality of integral lenses on its other surface. The term lensfiche has been applied to such an article of manufacture. Images are formed on the microfiche by a method there described and also described is a method and apparatus for projecting the recorded intelligence. According to the teachings of that patent, the end result of the taking or recording of optical information is a plurality of distributed microimages on the photographic emulsion. These microimages are termed information sets and are interlaced over the surface of the emulsion and whose elements are distinct as are the pieces of a jig-saw puzzle. The totality of information sets recorded on the emulsion forms a mosaic whose individual elements are the dispersed areas of the various information sets. In turn, each information set corresponds to a macro scene which, quite simply, may be regarded as the scene which is optically recorded in accordance with the teachings of that patent. For a more complete understanding, the attention of the reader is invited to it.

My prior U.S. Pat. Nos. 3,865,485 and 3,824,609 also describe such devices.

While the making of a single microfiche element is known, having been described in the above-mentioned U.S. Patents, the problem of mass producing microfiche copies would, at first blush, entail the use of silver bromide and photographic emulsions, such emulsions having been used in the original recording or photographing process. However, the cost of silver and the technology of photograpic emulsions necessarily sets a minimum cost and technology requirement for the mass production of duplicates of a microfiche. According to the practice of this invention the cost of silver and of photographic emulsion technology is reduced. In one embodiment, after a master microfiche is made, it is positioned in parallel proximity to the photographic surface of the photoresist block. Light is caused to illuminate the rear of the master microfiche and to thereby project the microimages on the emulsion of the master onto the photoresist surface of the photoresist block. Depending upon whether a positive or a negative photoresist technique is employed (such techniques being well known in the photographic art) the active photoresist surface is developed and processed to thereby yield a finished relief surface. The relief surface is defined by a plurality of upstanding spikes.

The number of spikes per unit area is the same over the finished relief surface. The size of the spikes, i.e., their height and thickness, varies however. Such variation is in accordance with variations of brightness of the original macro scene which were first photographically recorded. There is thus a correspondence between the information sets defined by the microimages on the master and the fixed distribution and variable size of the spikes over the surface of the photoresist block. Next, a raw microfiche blank is formed from a transparent sheet, one surface of the sheet being provided with a relatively thin and opaque coating. The opaque coating corresponds to photographic emulsion. The spiked or relief surface of the photoresist block is now pressed onto the thin, opaque coating to thereby rupture it in the immediate area of the spikes. The opaque coating is thus provided with a plurality of optical apertures which completely correspond or, synonymously, are homologous, to the original photographic microimages. Next, or simultaneously with the above process, the top surface of the microfiche blank is formed by embossing so as to form a plurality of integral lenses. The end result is a microfiche substantially identical to that described in my basic U.S. Pat. No. 3,864,034, with the exception that instead of microimages, the microfiche carries an opaque coating on its lowest surface, the coating having a plurality of optical apertures.

Figure 1:
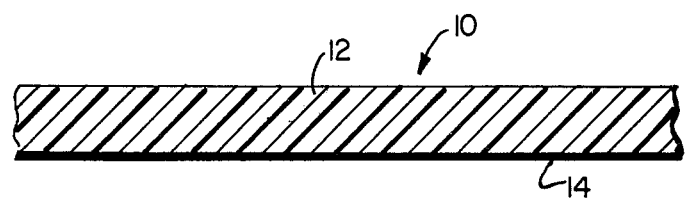
FIG. 1 is a typical partial cross-section view illustrating a blank employed for the construction of microfiche copies.
Figure 2:
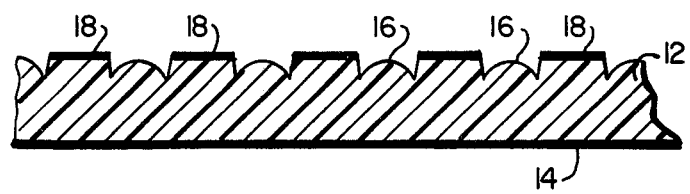
FIG. 2 is a partial cross-section view of a complete microfiche.
Figure 3:
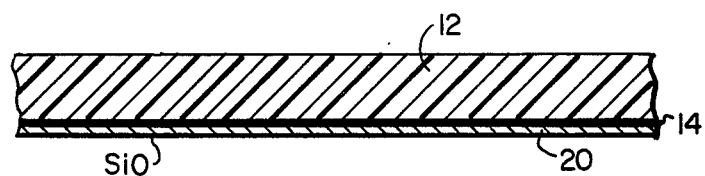
FIG. 3 is a view similar to FIG. 1 and illustrates an embodiment employing a protective coating.

Referring now to the drawings, the numeral 10 denotes generally a typical virgin blank or substrate in the general form of a planar member from which microfiche elements are to be fabricated. The numeral 12 denotes the main portion of the substrate 10 and consists of a thermoplastic material such as polycarbonate. The numeral 14 denotes a thin, opaque film, preferably of a metal, such as aluminum. An aluminum film of at least 100 angstroms is opaque to visible light. FIG. 2 illustrates the substrate 10 after completion of several of the operations according to this invention, later to be described. Thus, the numeral 16 denotes any one of a plurality of integral lenses, termed lensettes because of their small size, distributed in a generally regular array over the entire face of the completed microfiche element. The numeral 18 denotes opaque, inter-lensette portions also distributed over the entire face of the finished microfiche. The lensette element 16 and opaque portions 18 cooperate with information sets on the lower side of the substrate in a manner known in this art and accordingly further description need not be given. FIG. 3 is a view similar to FIG. 1 and indicates the addition of a protecting coating or film denoted by the numeral 20 which may be of silicon oxide. This coating functions to protect opaque layer 14 against scratches which are always a problem in microfiche or lensfiche structures. As illustrated at FIG. 3, the coating 20 is applied to the opaque surface 14 prior to stamping (such stamping to be later described) although it is possible to apply such coating to fully complete microfiche copies, for example, a one-half mil protective film.

Figure 4:
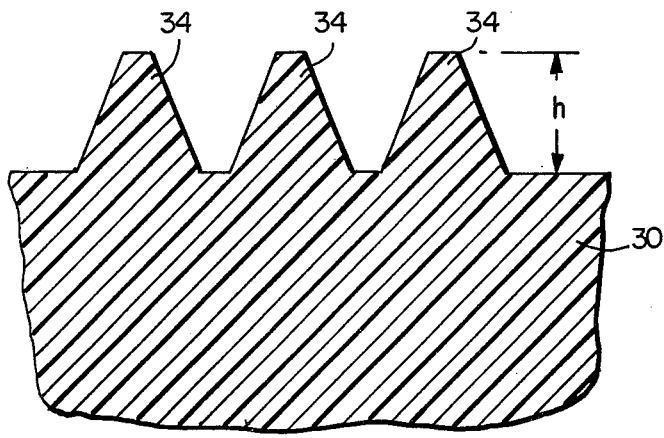
FIG. 4 is a greatly magnified partial cross-sectional view of the relief surface of a photoresist block after being processed.

FIG. 4 of the drawings illustrates, in greatly magnified form, a finished relief surface of a photoresist stamping block. The relief surface is defined by upstanding spikes or nodules 34. The spikes may be conical or pyramidal in shape and are distributed throughout the entire top area of a photoresist block. A typical material from which the embossing or stamping photoresist block 30 is formed is nickel because of its high strength. The letter h denotes the height of the spikes 34, this height representing the amount of material removed from the top of block 30 after processing (in the case of etching).

Figure 5:
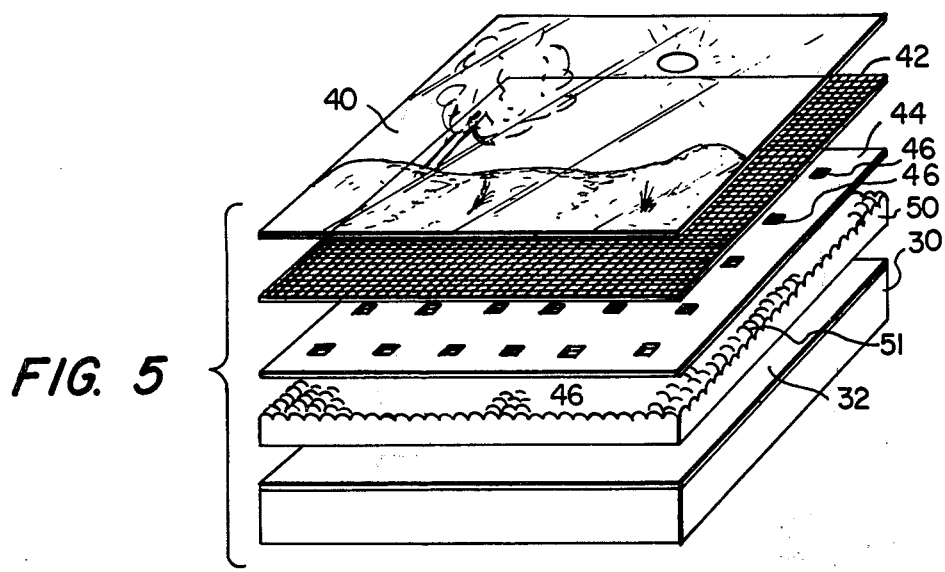
FIG. 5 is a partially schematic view illustrating a method of making a master relief or photoresist block employed for making copies.

FIG. 5 illustrates one method of making a stamper or embossing element such as 30 of FIG. 4. The numeral 40 denotes a master transparency of a scene which is to be optically recorded. The scene on the transparency is here illustrated as an outdoor scene consisting of a tree, the sun, and a few small hills. It will be understood, however, that any type of recording may be placed on the master transparency 40 and it will be further observed that the method of making such master transparencies is known and is outside of the scope of this invention. The numeral 42 denotes a screen consisting of accurately spaced horizontal and vertical lines of the type well known in the photographic and printing arts. Typically, its lines are spaced 100 lines per inch. The screen is placed, as illustrated, beneath the transparency 40. The numeral 44 denotes an opaque plate or mask having regularly spaced apertures 46 over its surface, the mask 44 being termed a selector mask. The numeral 50 denotes a lensfiche element of the type described in my above-noted patents, except that it does not have any photographic emulsion or any other coating on its lower surface. The lens elements or lensettes 51 on its top surface may be of a size shown in my above-noted patents and (typically) serve to reduce or to magnify by a factor of 25. Lensfiche 50, selector mask 44, screen 42 and master transparency 40 are all parallel and in practice are sandwiched together on top of the photoresist block 30. Now, the first macro scene is to be recorded. To do this, the transparency 40 is illuminated from above, the light passing down through screen 42, a portion passing through selector mask openings 46, that portion in turn passing through the lensettes 51 (a single lensette being associated in optical alignment with a single and corresponding mask opening 46) and finally passing onto photoresist surface 32. This completes the photographic exposure for the first transparency 40 corresponding to a first macro scene. Next, the photoresist block 30 is indexed so as to expose fresh or virgin photoresist material directly underneath the mask openings 46. Also, a second master transparency 40 having a second macro scene thereon is placed on top of screen 42. The illumination process is repeated. For the third taking, the block 30 is again indexed to reveal fresh or virgin photoresist material directly underneath an optical alignment with the mask openings 46 and a third master transparency 40 having a third scene thereon placed on top of screen 42. It is of course understood that each master transparency 40 is removed after the illumination process, so that only one master transparency at a time is on top of the sandwiched assembly.

As a typical example, and following the parameters set forth in my earlier noted patents, a process would embrace the recording on the photoresist material 32 of 625 master transparencies 40. The stamper block 30 is now ready for processing by either etching (taking metal away) of electroforming (adding metal). Etching and electroforming are well known in the art, such as in the art of micro-electronic circuitry and module formations, and hence need not here be described. With the stamper block 30 now having the relief surface on its top defined by a plurality of upstanding spikes 34, the next stage for making or mass producing copies is set. The spiked surface of block 30 is pressed onto opaque surface 14 of a blank. The opaque surface must be much thinner than h. This punctures the opaque surface at the immediate region of each spike, the block is now withdrawn from the opaque surface and, except for the formation of the lensettes 16 and opaque portions 18, the microfiche is complete. It will be observed that the punctures or ruptures on the opaque surface 14 due to the spikes 34 define a plurality of information sets which completely correspond to the microimages in the photographic emulsion of microfiche elements made in accordance with my above-noted patents. However, the need for photographic emulsion with the attendant silver bromide and photographic technology is not required by the practice of this invention. All that is required is the stamping block having the spikes 34 which correspond to the information sets, which in turn correspond to the macro images, and an opaque surface 14 which is rupturable by these spikes. While the opaque surface 14 has been illustrated as applied to the plastic substrate 12 prior to the spiking or hole formation process, it is apparent that an opaque coating such as 14 may be suitably spiked and then applied to the under surface of the plastic 12.

The reader will now be in a position to comprehend the important role of screen 42. The screen causes spikes 34 to be formed at all bright areas of the scene. On those macro scenes of which there were large bright areas (such as large areas corresponding to a sky) there would otherwise be no spikes and hence no punching of the opaque coating 14. This, of course, does not happen when the spikes are present throughout such large areas and therefore such large areas will appear bright in the final viewing. Note that no problems are encountered in dark areas of the macro scene, since the screen 42 plays no role within such dark areas.

The degree of contrast to be found in the duplicates depends on the position and nature of the screen 42. If the screen is directly up against the intelligence of master 40, it is preferable, as is well known to those versed in the art of commercial printing, to use a so-called vignetted dot contact screen. On the other hand, if the screen 40 is positioned somewhere between 40 and 44, then a cross-line half-tone screen is to be used. The amount of contrast desired depends upon the position of this screen.

The size and distribution of the spikes over the relief surface of the stamping block 30 is determined in the following manner. Consider first a case wherein there are no dark areas whatsoever on transparency 40. Now, light is directed from above onto the clear transparency and onto screen 42, through mask openings 46, through the lens plate 50 and onto photoresist 32. While there is a uniform intensity of light from the source, the light falling on photoresist 32 will be discontinuous because of the dark lines of the grid. After development of the photoresist by, for example, the etching process, (although it makes no difference whether it or electroforming is used) the height and thickness of each spike and the interspike distance will be the same.

Consider now a case wherein there are variably dispersed dark and light areas on the master transparency 40, such as would be the case in practice. Again, the illumination and spike producing process is repeated. At the conclusion of the (electroforming or etching) process, those areas on the top surface of stamping block 30 which received a maximum amount of light generate spikes of the greatest cross-sectional area. The areas on the photoresist surface directly beneath darker areas on the master transparency generate (result in) spikes of lesser height and of lesser thickness. No matter what the intensity of the light, however, the inter-spike distance will be the same. Of course, where no light whatsoever is incident upon the photoresist surface 32, there will be no spike formation at those regions.

Assume the number of fine lines per inch on screen 42 to be N. If the reduction ratio is 1/m where m is the magnification upon final viewing, then the number of lines per inch of the photoresist would be m×N. Typically N is 100 lines per inch and M=25, therefore, recordation is made of 2500 per inch on the photoresist surface 32, the inter-line spacing is 1/2500 of an inch or 0.4 mils or 10 microns. There are, at present, commercially available photoresists, for example, Kodak Thin Film Resist, which can accommodate, so to speak, 1 micron resolution. This is more than ample for the practice of this invention. Hence, in this specific example, the bit area, being the area between the spikes 34, is 10 microns × 10 microns, or 100 sq. microns. Therefore, for a 4 mil × 4 mil image from 1 lensette corresponding to an area 100 microns × 100 microns for m=25 on the master transparency 40, there can be a total of 100 bits of information stored. If, on the other hand, a screen 42 of 200 lines per inch is employed, then 400 bits of information can be stored. The greatest resolution the human eye can accommodate in a 100 mil × 100 mil area is around 225 bits at the normal reading distance. Accordingly, there is no requirement for 200 lines per inch or greater at a magnification of 25 for the screen 42.

In FIG. 5, the screen 42 is placed between master intelligence 40 and selector mask 44. A vignetted dot contact screen having around 2500 dots per inch may be placed directly in contact with the photoresist 32, or, a half-tone screen may be used having in the neighborhood of 2500 cross-lines to the inch. In the latter case, a transparent spacing film determining a fixed distance between 42 and photoresist 32 must obtain. This fixed distance will determine the degree of contrast desired.

Figure 6:
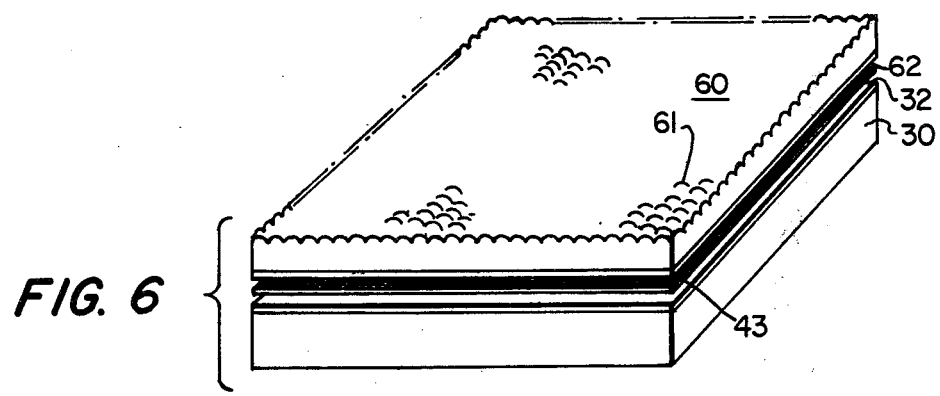
FIG. 6 is a partially schematic view indicating another method of forming a relief or master photoresist block.

Referring now to FIG. 6 of the drawings, another method forming a master photoresist punching block having a relief surface is illustrated. Here, it is assumed that a microfiche 60 having integral lensettes 61 on its top surface and photographic emulsion 62 on its bottom surface, the emulsion already carrying developed or fixed micro images is available. Such a microfiche may be obtained by techniques shown in my noted-above patents. Again, virgin photoresist block 30 having photoresist emulsion 32 is employed. Between microfiche 60 and photoresist block 30 is located a very finely divided screen 43 positioned directly on the photoresist surface; the screen 43 has 2500 lines per inch, for example. If screen 43 is in contact with photoresist 32, a vignetted contact screen is preferred. If screen 43 is spaced a distance away from photoresist 32 by a transparent film, a cross-line half-tone screen is to be used. The elements are so placed in positions as illustrated at FIG. 6. The entire top of microfiche 60 is now illuminated. This results in an optical transformation of the information on developed emulsion 62 to the photographically sensitive surface 32. The block 32 is now taken and subjected to known etching or electroforming processes for producing a relief surface having spikes 34 which, again, entirely correspond to the micro information sets on the original film 62. The completed block 30 is now utilized as previously described to make copies of microfiche elements.

Figure 7:
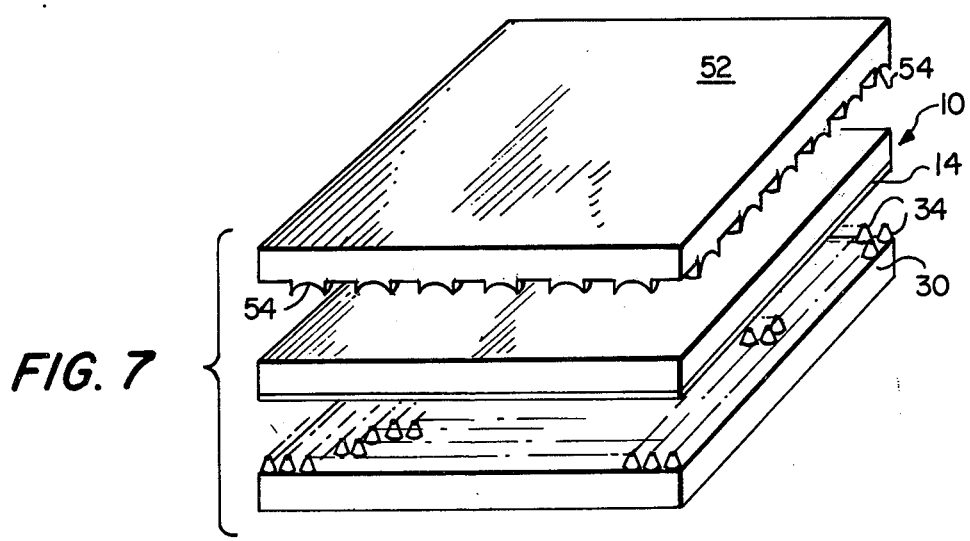
FIG. 7 is a partially schematic view illustrating one method for the simultaneous formation of lens elements on a microfiche and the recording of optical information thereon to thereby insure a maximum of accurate registry between the lenses on one surface of the microfiche and the information on the other surface.

Referring now to FIG. 7 of the drawings, another embodiment for making microfiche copies on a mass production basis is illustrated. Here, a photoresist block 30 having spikes 34 formed in accordance with any of the above processes is employed. A virgin or raw microfiche blank 10 of the type illustrated at FIG. 1 is positioned as illustrated at FIG. 7, with embossing die 52 having a lower surface 54 which will produce, upon stamping or embossing, a surface such as the top surface of a completed microfiche element shown at FIG. 2. The two elements 52 and 30 now squeeze, in a sandwich manner, the virgin blank 10 to form the final product. Thereafter, the inter-lensette surfaces may be suitably coated, and, if desired, the lower surface of the now completed copy 10 may be provided with the protective film such as silicon oxide 20 of FIG. 3.

The above description has been directed to a process for duplicating, in an inexpensive manner, lensfiche elements. The invention however, is not restricted to the duplication of such elements. For example, the invention may be employed to duplicate motion picture film. The reader is in a position to comprehend that duplication of motion picture film entails the same basic steps, with the photoresist block 30 assuming the form of a continuous and preferably flexible metal strip. The top surface of this metal strip would be provided with a photoresist coating 32, the original motion picture film would correspond to master transparency 40 and a grid 42 (in the form of a continuous strip) again would be employed. At the conclusion of the formation of the master punching block (now in the form of a continuous, elongated flexible metal strip) the block would be employed to continuously punch or rupture an opaque film or coating, such as a coating of thin aluminum, carried by a flexible and transparent strip. After such punching, the film would be projected in the conventional manner. This latter strip with the opaque, punched coating defines the motion picture film copy. Clearly, economy is realized by the practice of this invention as applied to the duplication of motion picture film in that the expense of silver bromide emulsions is not present, and further, the technology of photographic film processing is not required. Another advantage in this application of the invention is that, upon projection, the darkened or black areas of a conventional emulsion film absorb heat energy (infra red wave lengths) from the source of illumination, such as an arc lamp. To counteract this heat absorption, it has often been necessary to device rather elaborate and accordingly costly heat dissipation devices for use in projectors, especially those of large size. But with the practice of this invention, (in the event that aluminum or other highly reflecting material is employed as the coating for the transparent film) that light which is not projected on the viewing screen, i.e., light which passes through the punched holes, is reflected and not absorbed by the film.

The invention has been described with reference to a metal photoresist block. It will be apparent however that the specific material from which the punch block 30 is formed, as well as the specific manner of forming the spikes 34, do not limit the invention. However, other methods may be employed to fashion the stamper.

For example, thermoplastic materials could be employed from which to fabricate the punch block. (See Kazan & Knoll, "Electronic and Image Storage", Academic Press (1964), page 442). Further, a screen 42 (FIG. 5) or 43 (FIG. 6) having a uniformly spaced grid will, using the described metal photoresist block, yield spikes being uniformly spaced from each other. The spikes will vary in height as in thickness with variations in light intensity. Again, the invention is not limited to such spike configurations. For some applications the grid spacing may be non-uniform over the screen, and the spike variation may be limited to variations in spike thickness. The central theme of the invention is the replication of distributed information sets by punching, such that upon projection of light through the microfiche copy there exists a faithful reproduction of the original macro scenes, by way of faithful reproduction of their corresponding micro images. The master transparency which is to be duplicated and then inexpensively mass produced may be in the convention form such as that denoted by the numeral 40 of FIG. 5, or it may be an already-formed microfiche carrying micro images such as that denoted by the numeral 60 of FIG. 6.

I claim:

1. A method of making optical elements including the steps of,
   (a) forming a blank of a generally transparent sheet carrying on one side thereof a thin, opaque coating,
   (b) forming a photoresist block having a relief surface, said relief surface corresponding to a plurality of microimages of a plurality of macro scenes,
   (c) pressing said relief surface onto said thin, opaque coating of said sheet to selectively rupture portions of the coating and form apertures corresponding to the raised portions of said relief surface,
   (d) whereby the ruptured portions of the thin, opaque surface correspond to the plurality microimages of the plurality of macro scenes.

2. The method of claim 1 including the additional step of embossing the other side of said generally transparent sheet so that it has a plurality of integral lenses, the lenses being related to the ruptured apertures in the thin, opaque coating such that each sub-set of apertures which corresponds to each macro scene is in optical alignment with a unique sub-set of integral lenses.

3. A method of making a microfiche copy, including the steps of,
   (a) forming a photoresist block with a relief surface whose spike distribution thereon corresponds to a plurality of micro optical information sets, each information set corresponding to a unique macro scene, each information set occupying dispersed areas interlaced with but distinct from the dispersed areas occupied by any other information set,
   (b) pressing said relief surface against an opaque surface to thereby selectively rupture the opaque surface by the spikes only, there being an optical aperture formed in the opaque surface by each spike, whereby the opaque surface after the pressing contains optical apertures which are homologous with the original sets said opaque surface being an opaque coating on one surface of a generally transparent sheet.

4. A method of making copies of master transparencies containing information, including the steps of,
   (a) forming a relief surface on a metal substrate, said relief surface defined by upstanding spikes of variable height and thickness,
   (b) punching said spikes through an opaque coating carried by a transparent base,
   (c) whereby said transparent base after punching of its opaque coating modulates a projection beam of light thrown on a screen through the punched opaque coating to form an image.

5. A method of making copies of optical images including the steps of,
   (a) forming a relief surface on a substrate, said relief surface being defined by a plurality of upstanding spikes, the relief surface varying in relief over its area in correspondence with variations in said optical images,
   (b) by means of said up-standing spikes of said relief surface punching through an opaque coating carried by a transparent base,
   (c) whereby the punched opaque coating modulating a projection beam of light thrown on a screen through the punched opaque coating to form replications corresponding to the original optical images.

* * * * *